(12) United States Patent
Syed et al.

(10) Patent No.: US 9,379,090 B1
(45) Date of Patent: Jun. 28, 2016

(54) SYSTEM, APPARATUS, AND METHOD FOR SPLIT DIE INTERCONNECTION

(71) Applicant: QUALCOMM Incorporated, San Diego, CA (US)

(72) Inventors: Ahmer Raza Syed, Chandler, AZ (US); Chin-Kwan Kim, San Diego, CA (US); Omar James Bchir, San Marcos, CA (US); Milind Pravin Shah, San Diego, CA (US); Ryan David Lane, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/622,346

(22) Filed: Feb. 13, 2015

(51) Int. Cl.
| | |
|---|---|
| *H01L 23/34* | (2006.01) |
| *H01L 25/065* | (2006.01) |
| *H01L 23/538* | (2006.01) |
| *H01L 23/367* | (2006.01) |
| *H01L 23/00* | (2006.01) |
| *H01L 21/683* | (2006.01) |
| *H01L 25/00* | (2006.01) |

(52) U.S. Cl.
CPC ........ *H01L 25/0655* (2013.01); *H01L 21/6835* (2013.01); *H01L 23/3675* (2013.01); *H01L 23/5381* (2013.01); *H01L 23/5385* (2013.01); *H01L 23/5386* (2013.01); *H01L 24/32* (2013.01); *H01L 25/50* (2013.01); *H01L 2224/32225* (2013.01)

(58) Field of Classification Search
CPC ................ H01L 2924/00; H01L 24/01; H01L 21/67121
USPC .......................................................... 257/712
See application file for complete search history.

(56) References Cited

U.S. PATENT DOCUMENTS

| | | |
|---|---|---|
| 2005/0230842 A1 | 10/2005 | Swanson et al. |
| 2009/0284947 A1 | 11/2009 | Beddingfield et al. |
| 2010/0327424 A1 | 12/2010 | Braunisch et al. |
| 2011/0176280 A1 | 7/2011 | Lee |
| 2011/0233764 A1 | 9/2011 | Chang et al. |
| 2012/0056329 A1 | 3/2012 | Pagaila et al. |
| 2012/0261838 A1 | 10/2012 | Braunisch et al. |
| 2013/0093074 A1 | 4/2013 | Grant |
| 2014/0134803 A1 | 5/2014 | Kelly et al. |
| 2014/0134804 A1 | 5/2014 | Kelly et al. |

OTHER PUBLICATIONS

International Search Report and Written Opinion—PCT/US2016/014913—ISA/EPO—May 2, 2016.

*Primary Examiner* — Elias M Ullah
(74) *Attorney, Agent, or Firm* — Muncy, Geissler, Olds & Lowe, P.C.

(57) ABSTRACT

A semiconductor package for a side by side die configuration may include a substrate having a cavity, a bridge interposer positioned within the cavity and having an active side facing active sides of a first die and a second die and partially horizontally overlapping the first die and the second die to provide an interconnection between the first die and the second die, and a thermal element attached to backsides of the first die and the second die to provide a heat path and heat storage for the first die and the second die.

27 Claims, 11 Drawing Sheets

US 9,379,090 B1

SYSTEM, APPARATUS, AND METHOD FOR SPLIT DIE INTERCONNECTION

FIELD OF DISCLOSURE

This disclosure relates generally to semiconductor packages, and more specifically, but not exclusively, to split die semiconductor packages.

BACKGROUND

Semiconductor packages come in many varieties based on the intended application. A split die semiconductor package is a casing containing two semiconductor dies that provides protection against impact and holds the contact pins or leads that are used to connect from external circuits to the package. The split die architecture requires Die-to-Die (D2D) interconnects with very fine line and spaces (L/S—typically 1/1, 2/2). These fine line and spacing parameters are expensive to achieve and create problems with the requirement for exact placement of the die to align with the fine L/S routing. Conventional split die semiconductor packages either require a silicon interposer that acts like a bridge or embedded wafer level package (eWLP) with multiple redistribution layers (RDLs) that have fine line and space parameters. However, conventional interposers increase the height of the package, which is undesirable, and embedded multiple RDLs are complicated and expensive to manufacture plus they are not suitable for high volume manufacturing.

Accordingly, there are long-felt industry needs for methods that improve upon conventional methods including the improved methods and apparatus provided hereby.

The inventive features that are characteristic of the teachings, together with further features and advantages, are better understood from the detailed description and the accompanying figures. Each of the figures is provided for the purpose of illustration and description only, and does not limit the present teachings.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

Some examples of the disclosure are directed to systems, apparatus, and methods for a side by side semiconductor package including: a first die having an active side and a backside; a second die having an active side and a backside, the second die being horizontally adjacent the first die and spaced therefrom; a bridge interposer having an active side and a backside, the bridge interposer active side facing the active sides of the first die and the second die and partially horizontally overlapping the first die and the second die, the bridge interposer providing an interconnection between the first die and the second die; a first substrate having a cavity therein and attached to the backside of the bridge interposer such that the bridge interposer is positioned within the first substrate cavity; and a thermal element attached to the backside of the first die and the backside of the second die, the thermal element providing a heat path and heat storage for the first die and the second die.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
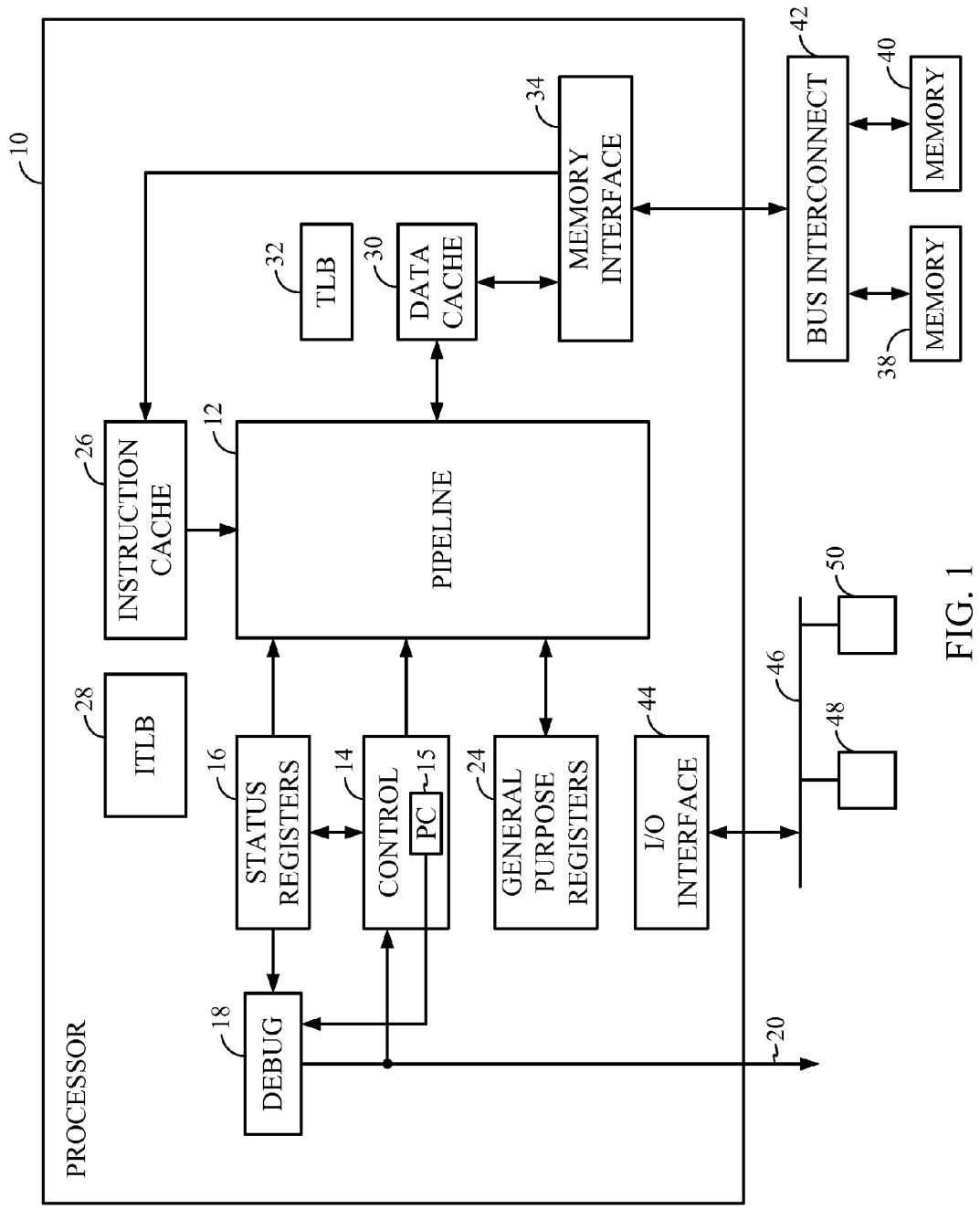
FIG. 1 illustrates an exemplary processor in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Methods, apparatus, and systems for interconnection of a split die semiconductor package are provided. In some examples, the split die semiconductor package includes a bridge interposer that has fine L/S of 2/2 or finer and is positioned within a substrate cavity, and a thermal element attached to the backsides of the die in the package. In some examples for PoP packages, the split die are also positioned within a substrate cavity of a second substrate. By placing the bridge interposer in a cavity of a package substrate and, if applicable, placing the die in another package substrate cavity, the overall height dimension of the package is reduced. The addition of a thermal element embedded in the second substrate provides a heat dissipation function without increasing the height. In addition, the connection of a fine L/S bridge interposer to the split die before the die are attached to a substrate using a self-aligning solder reflow process avoids the placement problems associated with connecting die with fine L/S to the bridge interposer after the die have been attached to a substrate.

Various aspects are disclosed in the following description and related drawings to show specific examples relating to the disclosure. Alternate examples will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and examples disclosed herein.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the examples described herein, the corresponding form of any such examples may be described herein as, for example, "logic configured to" perform the described action.

In this description, certain terminology is used to describe certain features. The term "mobile device" can describe, and is not limited to, a mobile phone, a mobile communication device, a pager, a personal digital assistant, a personal information manager, a mobile hand-held computer, a laptop computer, a wireless device, a wireless modem, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

FIG. 1 depicts a functional block diagram of an exemplary processor 10, such as an ASIC 208 (see below) configured to incorporate features of the improved data decompression. Processor 10 executes instructions in an instruction execution pipeline 12 according to control logic 14. Control logic 14 maintains a Program Counter (PC) 15, and sets and clears bits in one or more status registers 16 to indicate, e.g., the current instruction set operating mode, information regarding the results of arithmetic operations and logical comparisons (zero, carry, equal, not equal), and the like. In some examples, pipeline 12 may be a superscalar design, with multiple, parallel pipelines. Pipeline 12 may also be referred to as an execution unit. A General Purpose Register (GPR) file 20 provides a list of general purpose registers 24 accessible by pipeline 12, and comprising the top of the memory hierarchy.

Processor 10, which executes instructions from at least two instruction sets in different instruction set operating modes, additionally includes a debug circuit 18, operative to compare, upon the execution of each instruction, at least a predetermined target instruction set operating mode to the current instruction set operating mode, and to provide an indication of a match between the two. Debug circuit 18 is described in greater detail below.

Pipeline 12 fetches instructions from an instruction cache (I-cache) 26, with memory address translation and permissions managed by an Instruction-side Translation Lookaside Buffer (ITLB) 28. Data is accessed from a data cache (D-cache) 30, with memory address translation and permissions managed by a main Translation Lookaside Buffer (TLB) 32. In various examples, ITLB 28 may comprise a copy of part of TLB 32. Alternatively, ITLB 28 and TLB 32 may be integrated. Similarly, in various examples of processor 10, I-cache 26 and D-cache 30 may be integrated, or unified. Further, I-cache 26 and D-cache 30 may be L1 caches. Misses in I-cache 26 and/or D-cache 30 cause an access to main (off-chip) memory 38, 40 by a memory interface 34. Memory interface 34 may be a master input to a bus interconnect 42 implementing a shared bus to one or more memory devices 38, 40 that may incorporate the improved data decompression in accordance with some examples of the disclosure. Additional master devices (not shown) may additionally connect to bus interconnect 42.

Processor 10 may include input/output (I/O) interface 44, which may be a master device on a peripheral bus, across which I/O interface 44 may access various peripheral devices 48, 50 via bus 46. Those of skill in the art will recognize that numerous variations of processor 10 are possible. For example, processor 10 may include a second-level (L2) cache for either or both I and D caches 26, 30. In addition, one or more of the functional blocks depicted in processor 10 may be omitted from a particular example. Other functional blocks that may reside in processor 10, such as a JTAG controller, instruction pre-decoder, branch target address cache, and the like are not germane to a description of the present disclosure, and are omitted for clarity.

Figure 2:
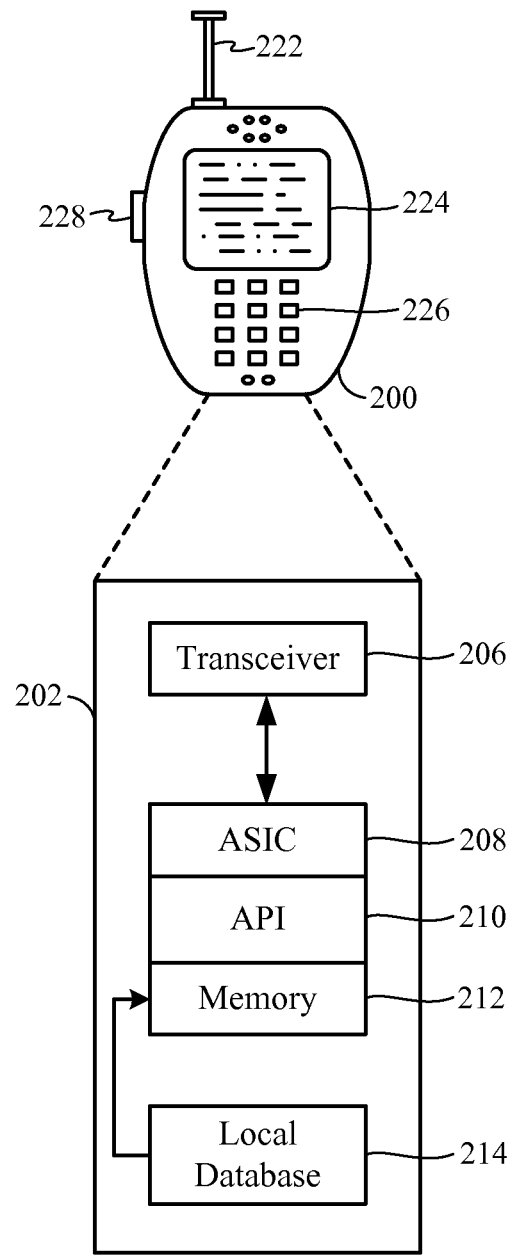
FIG. 2 illustrates exemplary user equipment (UE) in accordance with some examples of the disclosure.

Referring to FIG. 2, a system 100 that includes a UE 200, (here a wireless device), such as a cellular telephone, which has a platform 202 that can receive and execute software applications, data and/or commands transmitted from a radio access network (RAN) that may ultimately come from a core network, the Internet and/or other remote servers and networks. Platform 202 can include transceiver 206 operably coupled to an application specific integrated circuit ("ASIC" 208), or other processor, microprocessor, logic circuit, or other data processing device. ASIC 208 or other processor executes the application programming interface ("API") 210 layer that interfaces with any resident programs in memory 212 of the wireless device. Memory 212 can be comprised of read-only or random-access memory (RAM and ROM), EEPROM, flash cards, or any memory common to computer platforms. Platform 202 also can include local database 214 that can hold applications not actively used in memory 212. Local database 214 is typically a flash memory cell, but can be any secondary storage device as known in the art, such as magnetic media, EEPROM, optical media, tape, soft or hard disk, or the like. Internal platform 202 components can also be operably coupled to external devices such as antenna 222, display 224, push-to-talk button 228 and keypad 226 among other components, as is known in the art.

Accordingly, an example of the disclosure can include a UE including the ability to perform the functions described herein. As will be appreciated by those skilled in the art, the various logic elements can be embodied in discrete elements, software modules executed on a processor or any combination of software and hardware to achieve the functionality disclosed herein. For example, ASIC 208, memory 212, API 210 and local database 214 may all be used cooperatively to load, store and execute the various functions disclosed herein and thus the logic to perform these functions may be distributed over various elements. Alternatively, the functionality could be incorporated into one discrete component. Therefore, the features of UE 200 in FIG. 2 are to be considered merely illustrative and the disclosure is not limited to the illustrated features or arrangement.

The wireless communication between UE 200 and the RAN can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network. Accordingly, the illustrations provided herein are not intended to limit the examples of the disclosure and are merely to aid in the description of aspects of examples of the disclosure.

Figure 3:
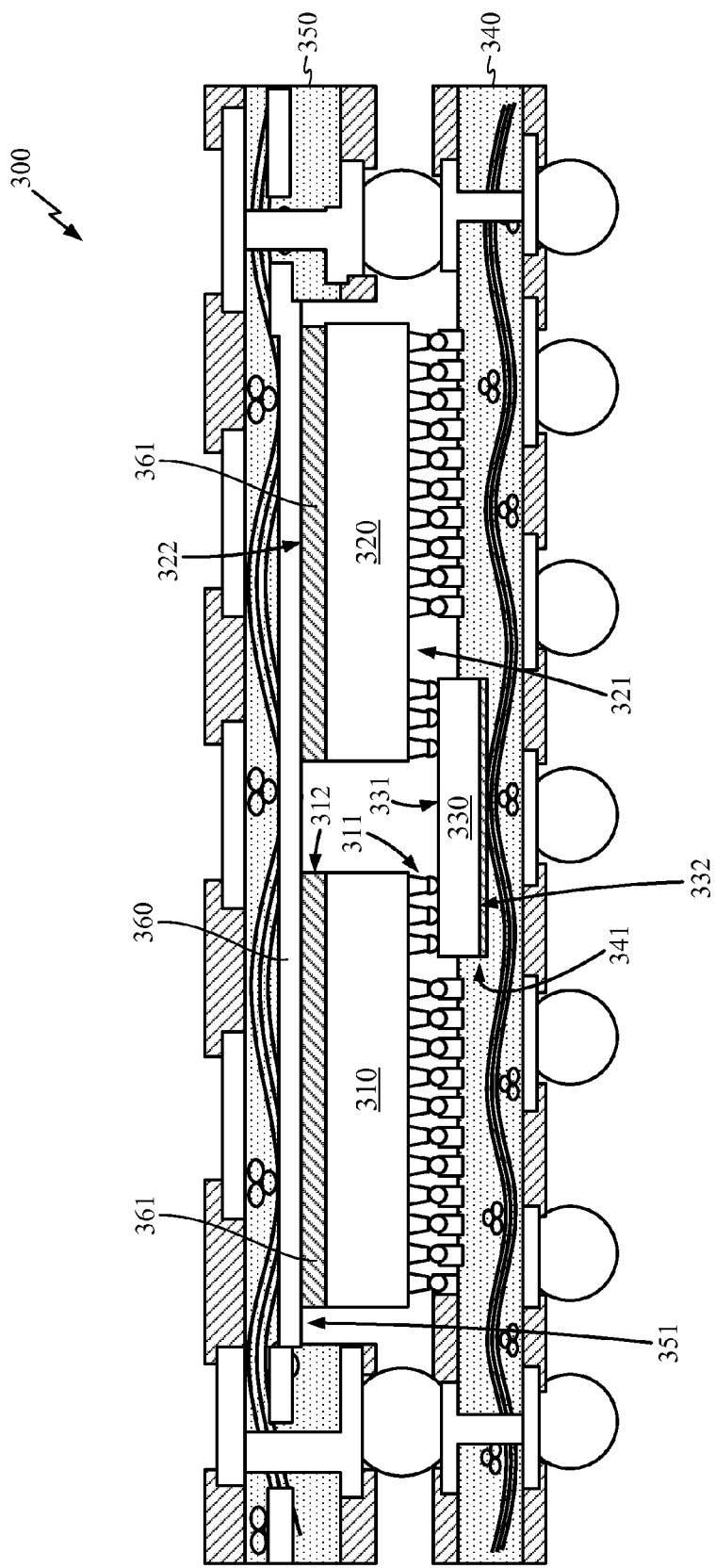
FIG. 3 illustrates an exemplary package on package (PoP) semiconductor package in accordance with some examples of the disclosure.

FIG. 3 illustrates an exemplary package on package (PoP) semiconductor package in accordance with some examples of the disclosure. As shown in FIG. 3, a semiconductor package 300 may include a first die 310 having an active side 311 and a backside 312, a second die 320 having an active side 321 and a backside 322, a bridge interposer 330 having an active side 331 and a backside 332, a first substrate 340 having a cavity 341, a second substrate 350 having a cavity 351, and a thermal element or layer 360. The second die 320 may be horizontally adjacent to and spaced from the first die 310. The thermal element 360 thermally coupled to the first die backside 312 and the second die backside 322. The thermal element 360 may be thermally coupled to the first die 310 through a thermal interface material layer 361. The thermal element 360, first die 310, and second die 320 may be positioned in the second substrate cavity 351. Alternatively, the thermal element 360 may be embedded in the second substrate 350 at a bottom surface of the second substrate cavity 351 and the first die 310 and the second die 320 may be in the second substrate cavity 351. The thermal element 360 provides a heat path, dissipation, and storage for the semiconductor package 300 and, in particular, the first die 310 and the second die 320.

The bridge interposer 330 may be positioned in the first substrate cavity 341 with the bridge interposer active side 331 facing the first die active side 311 and the second die active side 321 and the bridge interposer backside 332 facing the first substrate 340. The bridge interposer 330 partially overlaps the edges of the first die 310 and the second die 320 in the horizontal direction and is spaced slight below the first die 310 and the second die 320. The bridge interposer may include pathways, routings, or interconnections on the surface or therein to route signals between the first die 310 and the second die 320. These interconnections may have very fine L/S parameters such as 1/1 or 2/2. The semiconductor package 300 may or may not include a molding material encapsulating the first die 310, the second die 320, and the bridge interposer 330 as well as filling the empty space in the first substrate cavity 341, the second substrate cavity 351, and the space between the first substrate 340 and the second substrate 350. The bridge interposer active side 331, the first die active side 311, and the second die active side 321 may include bumps that provide external connections between the die or interposer and external elements.

Figure 4:
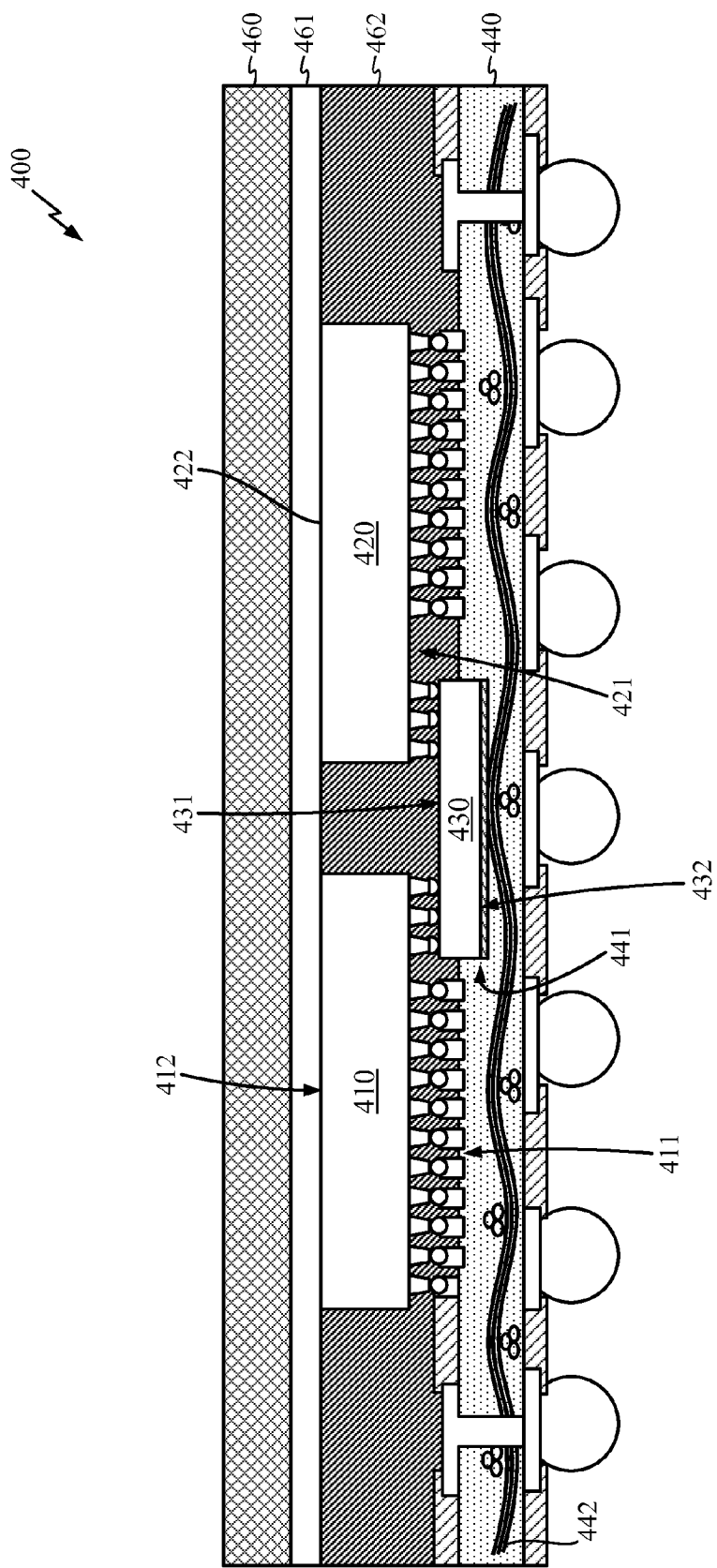
FIG. 4 illustrates an exemplary stand-alone semiconductor package in accordance with some examples of the disclosure.

FIG. 4 illustrates an exemplary stand-alone semiconductor package in accordance with some examples of the disclosure. As shown in FIG. 4, a semiconductor package 400 may include a first die 410 having an active side 411 and a backside 412, a second die 420 having an active side 421 and a backside 422, a bridge interposer 430 having an active side 431 and a backside 432, a substrate 440 having a cavity 441 and an embedded glass fiber 442 extending horizontally thorough the substrate 440, and a thermal element or layer 460. The second die 420 may be horizontally adjacent to and spaced from the first die 410. The thermal element 460 thermally coupled to the first die backside 412 and the second die backside 422. The thermal element 460 may be thermally coupled to the first die 410 through a thermal interface material layer 461. The thermal element 460 provides a heat path, dissipation, and storage for the semiconductor package 400 and, in particular, the first die 410 and the second die 420.

The bridge interposer 430 may be positioned in the first substrate cavity 441 with the bridge interposer active side 431 facing the first die active side 411 and the second die active side 421 and the bridge interposer backside 432 facing the substrate 440. The bridge interposer 430 partially overlaps the edges of the first die 410 and the second die 420 in the horizontal direction and is spaced slight below the first die 410 and the second die 420. The bridge interposer may include pathways, routings, or interconnections on the surface or therein to route signals between the first die 410 and the second die 420. These interconnections may have very fine L/S parameters such as 1/1 or 2/2. The semiconductor package 400 may or may not include a molding material 462 encapsulating the first die 410, the second die 420, and the bridge interposer 430 as well as filling the empty space in the substrate cavity 441 and the space between the substrate 440 and the thermal element 460. The bridge interposer active side 431, the first die active side 411, and the second die active side 421 may include bumps that provide external connections between the die or interposer and external elements.

Figure 5A:
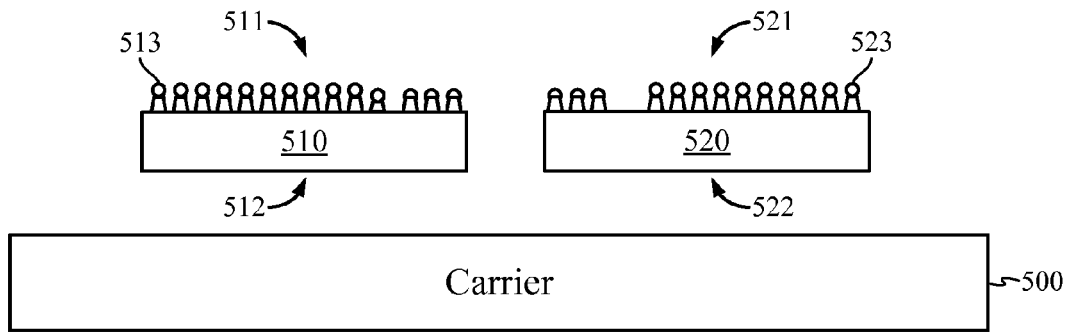
FIGS. 5A-K illustrate an exemplary partial process flow for manufacturing a PoP semiconductor package in accordance with some examples of the disclosure.
Figure 5B:
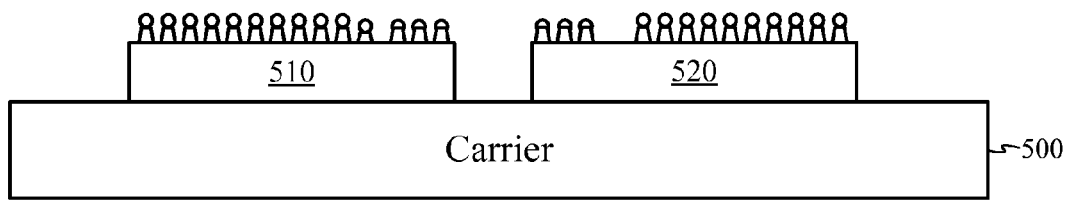
Figure 5C:
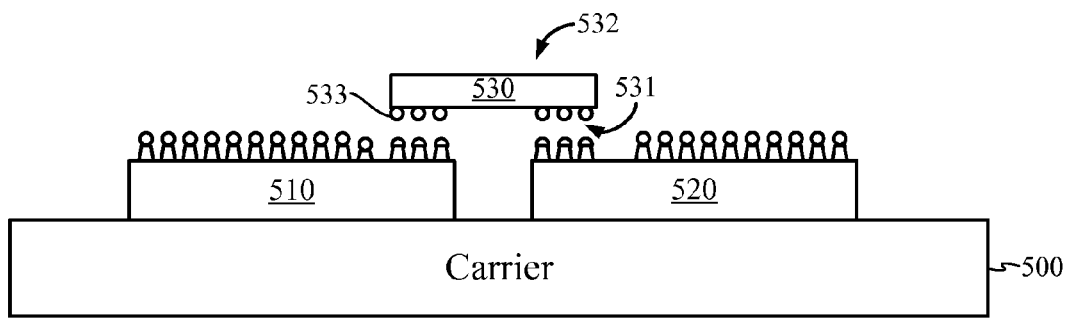
Figure 5D:
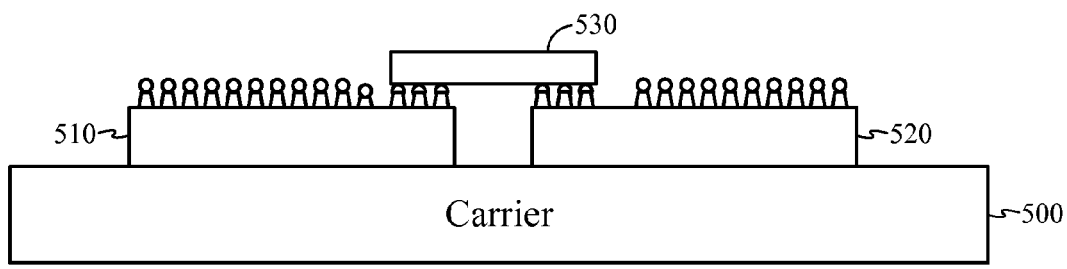

FIGS. 5A-K illustrate an exemplary partial process flow for manufacturing a PoP semiconductor package in accordance with some examples of the disclosure. The partial process flow begins as shown in FIG. 5A with a carrier 500, a first die 510 having an active side 511 and a backside 512, and a second die 520 having an active side 521 and a backside 522. The first die active side 511 may include external connection points or electrically conductive bumps 513 for connecting to pathways and devices external to the first die 513. The second die active side 521 may include external connection points or electrically conductive bumps 523 for connecting to pathways and devices external to the second die 523. As shown in FIG. 5B, the process continues with the placement of the first die 510 and the second die 520 on the carrier 500 with the backsides 512 and 522 attached to a surface of the carrier 500. As shown in FIG. 5C, the process continues with the addition of a bridge interposer 530 having an active side 531, a backside 532, and external connection points or electrically conductive bumps 533 on the active side 531 for connecting to pathways and devices external to the first die 513. The bridge interposer 530 may include internal or surface routing or pathways (not shown) with very fine L/S characteristics, such as 1/1 microns and 2/2 microns. As shown in FIG. 5D, the bridge interposer 530 is attached to the first die 510 and the second die 520 by attaching the bumps 533 to bumps 513 and bumps 523. This can be accomplished by a solder reflow process that self-aligns the fine bumps 533 with the bumps 513 and 523 to avoid the placement accuracy issues normally associated with pick and placing such fine L/S components. The active side 531 faces and partial overlaps the active sides 511 and 521.

Figure 5E:
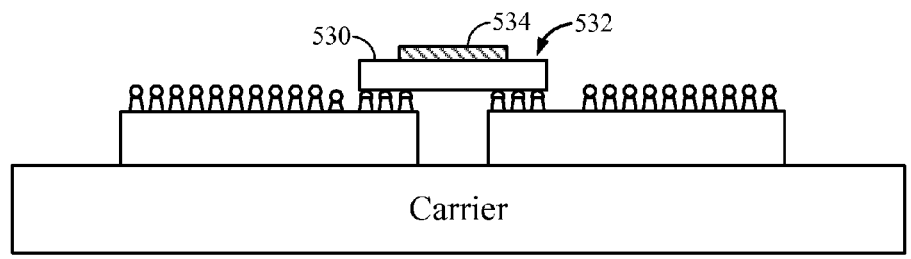
Figure 5F:
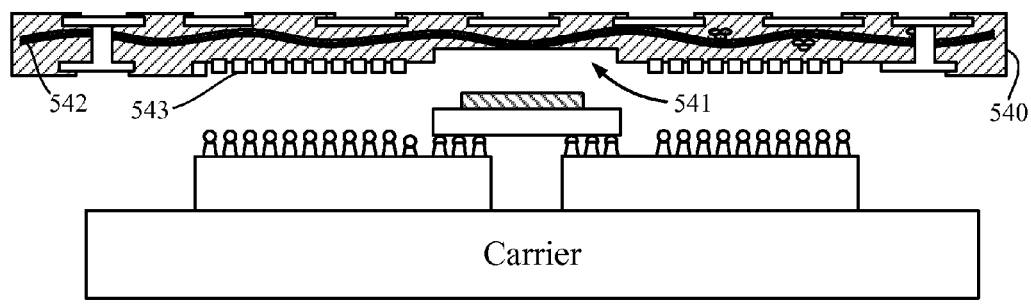

As shown in FIG. 5E, the process continues with the attachment of a bridge interposer adhesive layer 534 on the backside 532 of the bridge interposer 530. The adhesive layer 534 may be of different materials that allow the bridge interposer 530 to be securely attached to another component, such as a substrate. As shown in FIG. 5F, the process continues with the addition of a first substrate 540 having a cavity 541 centrally located in the horizontal direction, a glass fiber 542 extending horizontally thorough the substrate 540, and a plurality of external connection points or electrically conductive bumps 543 for connecting to pathways and devices external to the first substrate 540.

Figure 5G:
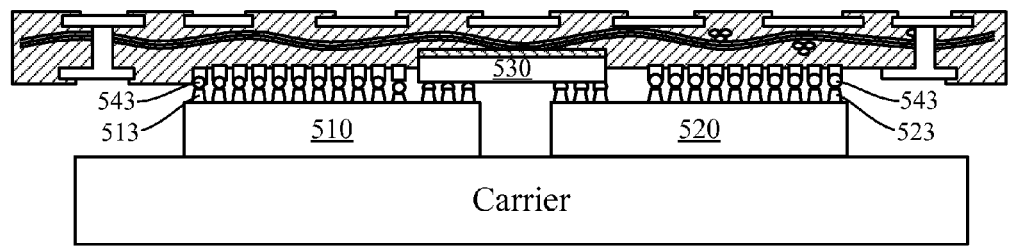
Figure 5H:
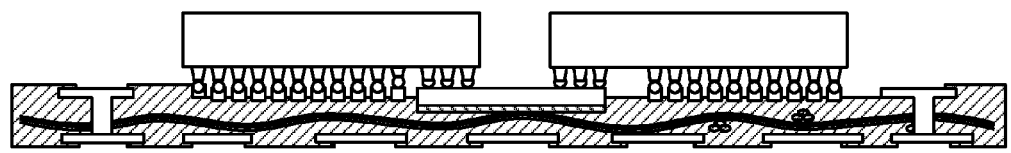

As shown in FIG. 5G, the first substrate 540 is attached to the bridge interposer 530 through the adhesive layer 534 such that the bridge interposer 530 is positioned within cavity 541, to the first die 510 and the second die 520 by attaching the bumps 543 to bumps 513 and bumps 523. This can be accomplished by a solder reflow process that self-aligns the fine bumps 543 with the bumps 513 and 523 to avoid the placement accuracy issues normally associated with pick and placing such fine L/S components. As shown in FIG. 5H, the process continues with the removal of the carrier 500 and re-orientation of the remaining package although the re-orientation is optional.

Figure 5I:
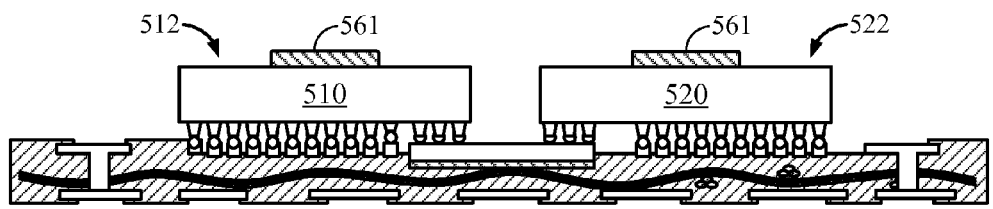
Figure 5J:
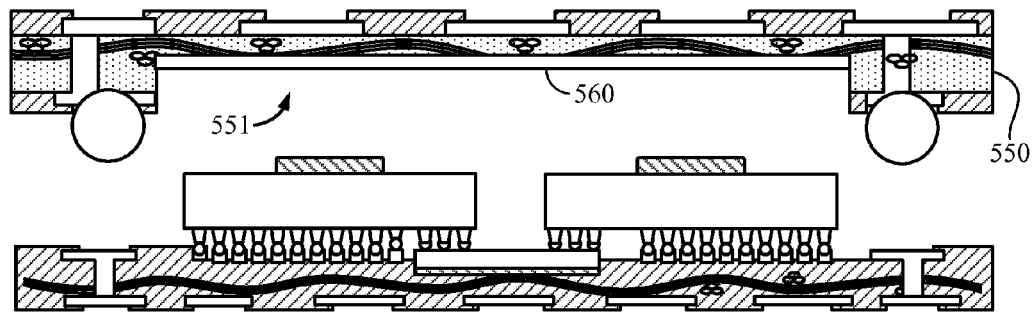
Figure 5K:
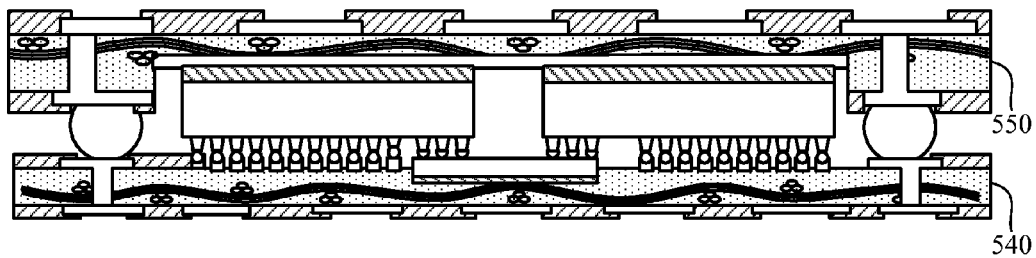

As shown in Fig. 5I, the process continues with application of a thermal interface material 561 to the backsides 512 and 522 of the die. The thermal interface material 561 acts as an adhesive as well as a thermal conductor to transfer heat away from the first die 510 and the second die 520. As shown in FIG. 5J, the process continues with the addition of a second substrate 550 having a cavity 551 and a thermal element or layer 560 embedded in the second substrate 550 or at or near the bottom surface of the cavity 551. The thermal element 560 provides a heat pathway, storage, and dissipation mechanism for the package and may be composed of material suitable for this purpose. As shown in FIG. 5K, the partial process concludes with the attached of the second substrate 550 to the first substrate 540. The thermal element 560 is attached to the thermal interface material 561 on the backsides 512 and 522 of the die so that the die 510 and 520 are centrally located within the cavity 551. The first substrate 540 is connected to the second substrate 550 through solder balls on the outside edges of the first substrate 540 and second substrate 550 that provides a spacing for the substrates and electrical pathways through associated vias, connection points, and solder balls. In addition, the empty spaces may be filled with an encapsulation or fill material if desired (not shown). The double cavity structure will reduce the package height versus conventional approaches for PoP semiconductor packages.

Figure 6A:
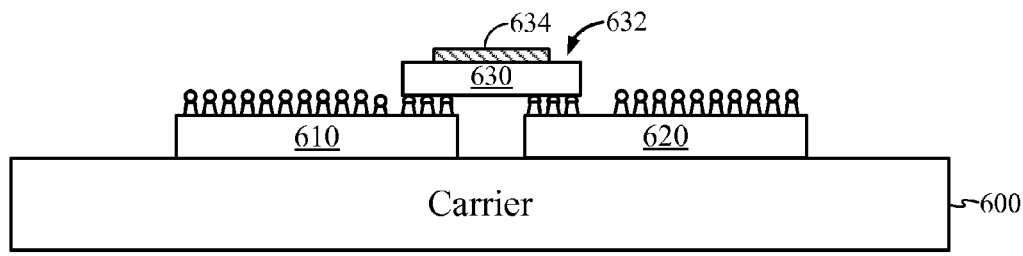
FIGS. 6A-D illustrate an exemplary partial process flow for manufacturing a stand-alone semiconductor package in accordance with some examples of the disclosure.
Figure 6B:
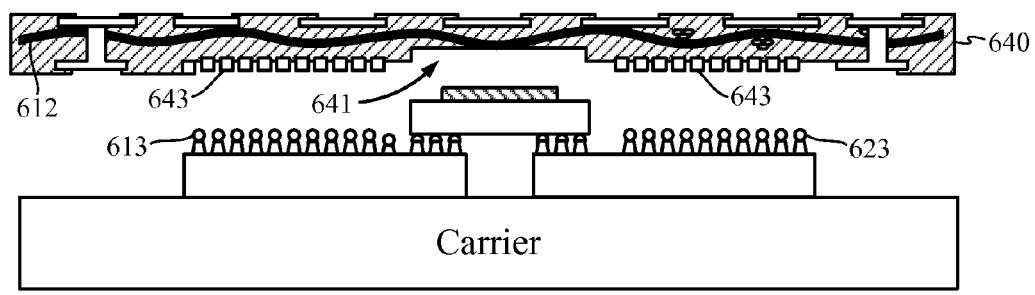
Figure 6C:
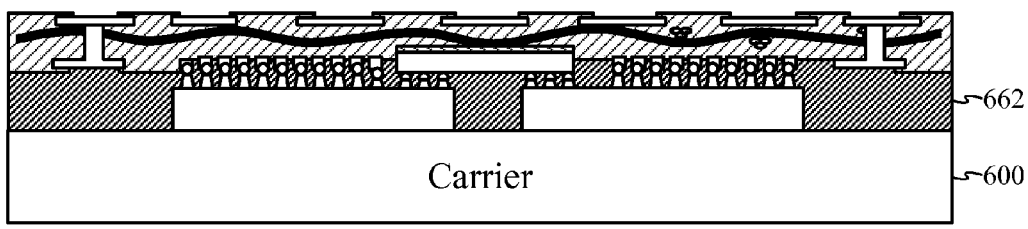
Figure 6D:
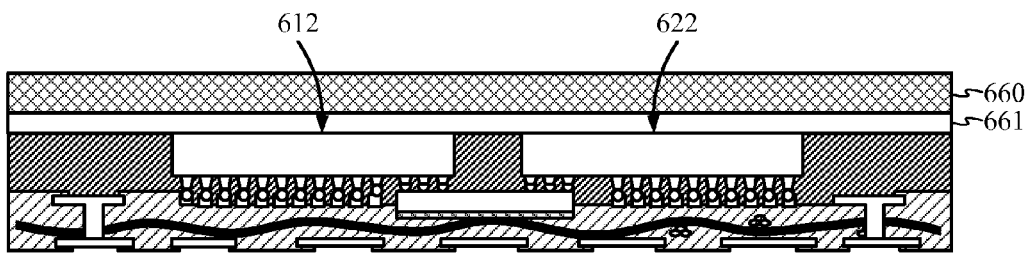

FIGS. 6A-D illustrate an exemplary partial process flow for manufacturing a stand-alone semiconductor package in accordance with some examples of the disclosure. The partial process flow begins similar to that described with respect to FIGS. 5A-D. Hence, those process steps will be skipped in this part of the description. As shown in FIG. 6A, the process continues with the attachment of a bridge interposer adhesive layer 634 on the backside 632 of the bridge interposer 630. The adhesive layer 634 may be of different materials that allow the bridge interposer 630 to be securely attached to another component, such as a substrate. As shown in FIG. 6B, the process continues with the addition of a substrate 640 having a cavity 641 centrally located in the horizontal direction, a glass fiber 642 extending horizontally thorough the substrate 640, and a plurality of external connection points or electrically conductive bumps 643 for connecting to pathways and devices external to the substrate 640. As shown in FIG. 6C, the substrate 640 is attached to the bridge interposer 630 through the adhesive layer 634 such that the bridge interposer 630 is positioned within cavity 641, to the first die 610 and the second die 620 by attaching the bumps 643 to bumps 613 and bumps 623. This can be accomplished by a solder reflow process that self-aligns the fine bumps 643 with the bumps 613 and 623 to avoid the placement accuracy issues normally associated with pick and placing such fine L/S components. An encapsulation material or mold material 662 is applied to fill the empty spaces between carrier 600 and substrate 640. As shown in FIG. 6D, the process continues with the removal of the carrier 600, re-orientation of the remaining package although the re-orientation is optional, application of a thermal interface material 661 to the backsides 612 and 622 of the dies 610 and 620, and the addition of a thermal element or layer 660 to the thermal interface material 661. The thermal interface material 661 acts as an adhesive as well as a thermal conductor to transfer heat away from the first die 610 and the second die 620. The thermal element 660 provides a heat pathway, storage, and dissipation mechanism for the package and may be composed of material suitable for this purpose.

Figure 7A:
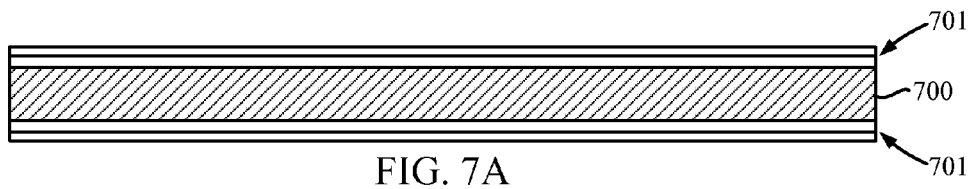
FIGS. 7A-L illustrate an exemplary partial process flow for manufacturing a semiconductor substrate in accordance with some examples of the disclosure.
Figure 7B:
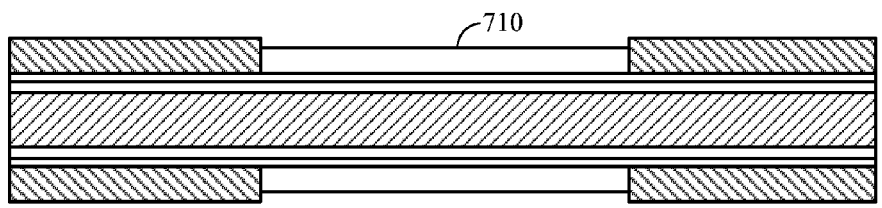
Figure 7C:
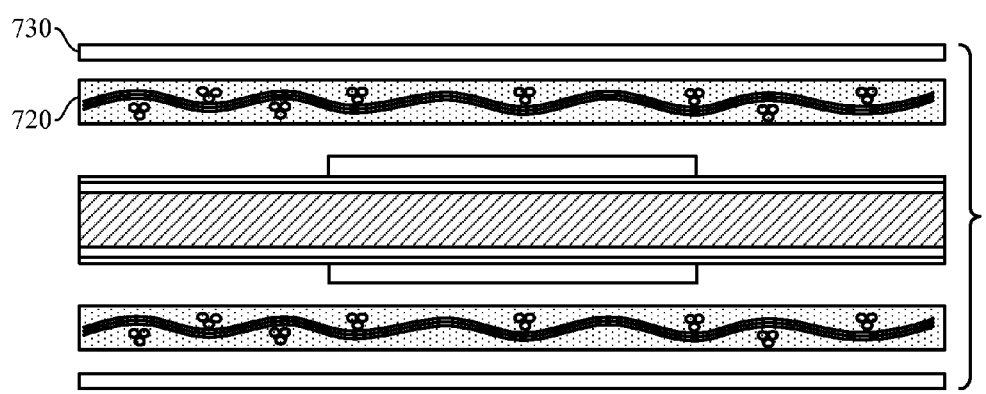
Figure 7D:
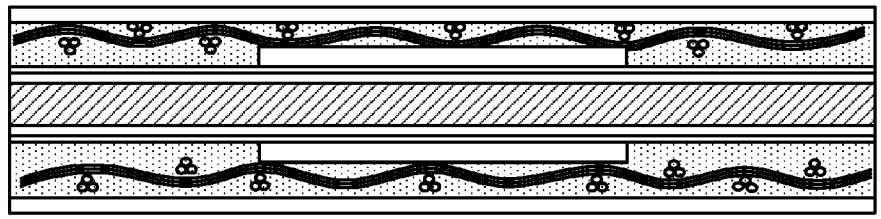

FIGS. 7A-L illustrate an exemplary partial process flow for manufacturing a semiconductor substrate in accordance with some examples of the disclosure. As shown in FIG. 7A, the partial process flow begins with a carrier 700 having seed layer 701. As shown in FIG. 7B, copper plating 710 is formed on carrier 700. The copper plating 710 is formed in the area or location of the future cavity. As shown in FIGS. 7C and D, the copper plated carrier 700 is laminated with a prepreg layer 720 and another seed layer 730. Prepreg 720 can be an impregnated resin layer with embedded glass fabric or similar type of layer. The embedded glass fabric may be embedded such that the glass fabric is offset from the center line of the prepreg layer 720. Alternatively, the prepreg layer can be constructed such that the embedded glass fabric is offset from the center line of the composite prepreg layer even though it may not be offset from the layer it is originally embedded within. The embedded glass fabric can be continuous or nearly continuous throughout the prepreg layer 720. In alternative constructions, the glass fabric can be centered and the cavity can be formed without damaging the centered glass fabric. Carrier 700, prepreg 720 and seed layer 730 are laminated together to form one composite structure as shown. Although top and bottom layers are shown in FIGS. 7C and D for the composite structure, the composite structure can be formed on one side only if so desired.

Figure 7E:
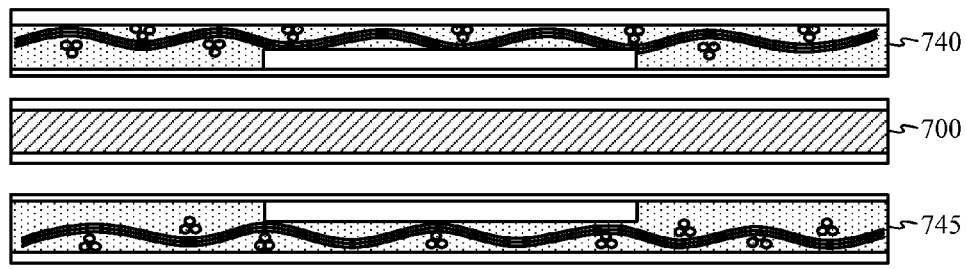
Figure 7F:
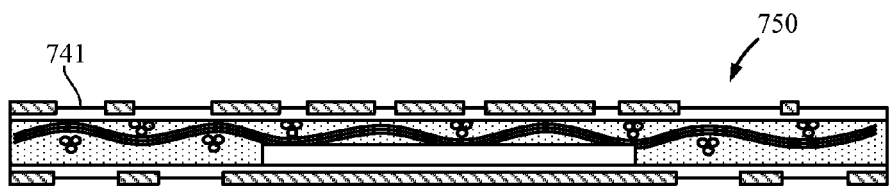
Figure 7G:
Figure 7H:
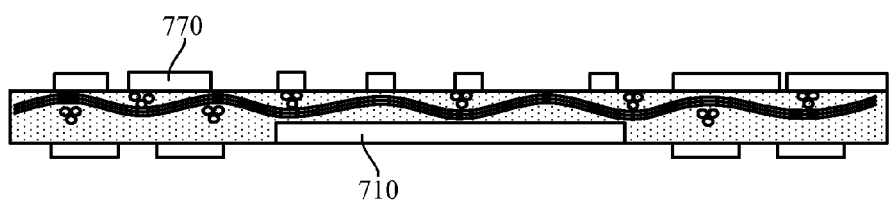
Figure 7I:
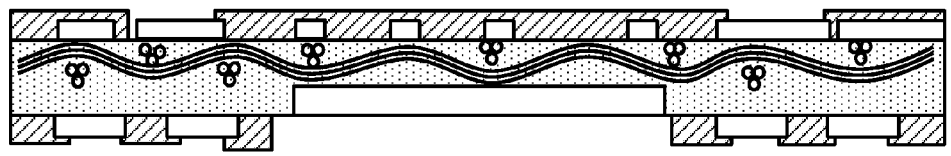
Figure 7J:
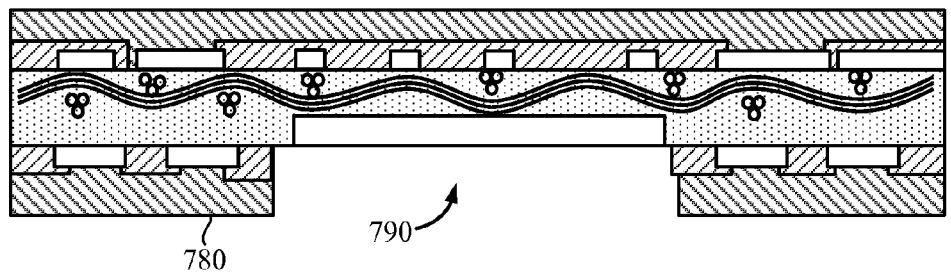
Figure 7K:
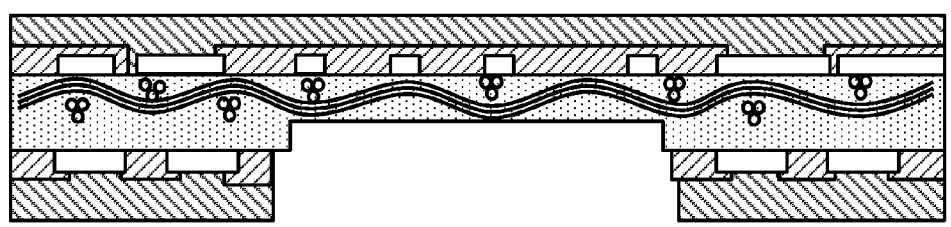
Figure 7L:
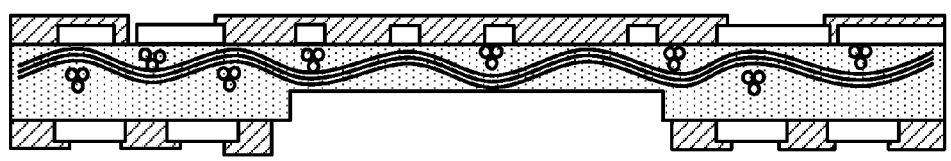

As shown in FIG. 7E, the carrier 700 is then separated from the composite structure forming separate substrates 740 and 745. We will describe further processing of the substrate with respect to only one substrate, but it should be understood that the further process can be applied to both substrates. As shown in FIG. 7F, after separating the carrier 700 from substrate 740, connection points 741 are formed in substrate 740 and substrate 740 is coated with a combination litho/cu plating layer 750. The plating layer 750 can be composed of lithographic resin and copper plating. As shown in FIG. 7G, the plating layer 750 is then stripped to expose various portions of substrate 740. The portions exposed can be arranged as needed to achieve a desired pattern. As shown in FIG. 7H, substrate 740 with exposed copper layer is further etched to remove seed layer 760 but keep copper portions 770 and copper plating 710. As shown in FIGS. 7I and J, following this etching process, a mask layer 780 is formed on substrate 740 except in the location of the future cavity or copper plating 710. Another etching process is applied to substrate 740 to form a cavity 790. In this etching process, the masked portions of substrate 740 are protected from etching and only the exposed copper plating 710 is etched away. As shown in FIG. 7K, after forming cavity 790, the copper plating 710 is stripped away from substrate 740. As shown in FIG. 7L, the mask layer 780 is stripped away. Next, a three stage process is applied to substrate 740. In the three stage process: a SR coating is applied, exposed, and then developed. After this three stage process, the substrate 740 structure may be ready for further processing such as surface finishing.

Nothing stated or illustrated depicted in this application is intended to dedicate any component, step, feature, benefit, advantage, or equivalent to the public, regardless of whether the component, step, feature, benefit, advantage, or the equivalent is recited in the claims.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some examples, some or a plurality of the most important method steps can be performed by such an apparatus.

The examples described above merely constitute an illustration of the principles of the present disclosure. It goes without saying that modifications and variations of the arrangements and details described herein will become apparent to other persons skilled in the art. Therefore, it is intended that the disclosure be restricted only by the scope of protection of the appended patent claims, rather than by the specific details presented on the basis of the description and the explanation of the examples herein.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that-although a dependent claim can refer in the claims to a specific combination with one or a plurality of claims-other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some examples, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative examples of the disclosure, it should be noted that various changes and modifications could be made herein without departing from the scope of the disclosure as defined by the appended claims. The functions, steps and/or actions of the method claims in accordance with the examples of the disclosure described herein need not be performed in any particular order. Furthermore, although elements of the disclosure may be described or claimed in the singular, the plural is contemplated unless limitation to the singular is explicitly stated.

What is claimed is:

1. A side by side semiconductor package, comprising:
   a first die having an active side and a backside;
   a second die having an active side and a backside, the second die being horizontally adjacent the first die and spaced therefrom;
   a bridge interposer having an active side and a backside, the bridge interposer active side facing the active sides of the first die and the second die and partially horizontally overlapping the first die and the second die, the bridge interposer providing an interconnection between the first die and the second die;
   a first substrate having a cavity therein and attached to the backside of the bridge interposer such that the bridge interposer is positioned within the first substrate cavity; and
   a thermal element attached to the backside of the first die and the backside of the second die, the thermal element providing a heat path and heat storage for the first die and the second die.

2. The semiconductor package of claim 1, further comprising a thermal interface material layer positioned between the thermal element and the first die backside and the second die backside.

3. The semiconductor package of claim 2, further comprising a bridge interposer adhesive layer on the bridge interposer backside, the bridge interposer adhesive layer attaching the bridge interposer to the cavity and filling in the cavity not occupied by the bridge interposer.

4. The semiconductor package of claim 3, wherein the bridge interposer has routing pathways with a line space parameter of 2/2 or smaller.

5. The semiconductor package of claim 4, further comprising a plurality of connection points on the bridge interposer active side, the first die active side, and the second die active side.

6. The semiconductor package of claim 5, wherein the plurality of bridge interposer connection points are coupled to a portion of the plurality of first die connection points and to a portion of the plurality of second die connection points to provide signal pathways between the first die and the second die.

7. The semiconductor package of claim 6, wherein the plurality of connection points having a line space parameter of 2/2 or smaller.

8. The semiconductor package of claim 7, wherein the semiconductor package is integrated into one of a mobile phone, a mobile communication device, a pager, a personal digital assistant, a personal information manager, a mobile hand-held computer, a laptop computer, a wireless device, or a wireless modem.

9. A side by side semiconductor package, comprising:
   a first die having an active side and a backside;
   a second die having an active side and a backside, the second die being horizontally adjacent the first die and spaced therefrom;
   a bridge interposer having an active side and a backside, the bridge interposer active side facing the active sides of the first die and the second die and partially horizontally overlapping the first die and the second die, the bridge interposer providing an interconnection between the first die and the second die;
   a first substrate having a cavity therein and attached to the backside of the bridge interposer such that the bridge interposer is positioned within the first substrate cavity;
   a second substrate having a cavity therein and attached to the backside of the first die and the back side of the second die such that the first die and the second die are positioned within the second substrate cavity; and
   a thermal element attached to the backside of the first die and the backside of the second die, the thermal element providing a heat path and heat storage for the first die and the second die.

10. The semiconductor package of claim 9, further comprising a thermal interface material layer positioned between the thermal element and the first die backside and the second die backside.

11. The semiconductor package of claim 10, further comprising a bridge interposer adhesive layer on the bridge interposer backside, the bridge interposer adhesive layer attaching the bridge interposer to the cavity and filling in the cavity not occupied by the bridge interposer.

12. The semiconductor package of claim 11, wherein the bridge interposer has routing pathways with a line space parameter of 2/2 microns or smaller.

13. The semiconductor package of claim 12, further comprising a plurality of connection points on the bridge interposer active side, the first die active side, and the second die active side.

14. The semiconductor package of claim 13, wherein the plurality of bridge interposer connection points are coupled to a portion of the plurality of first die connection points and to a portion of the plurality of second die connection points to provide signal pathways between the first die and the second die.

15. The semiconductor package of claim 14, wherein the plurality of connection points having a line space parameter of 2/2 microns or smaller.

16. The semiconductor package of claim 15, further comprising a first die adhesive layer on the first die backside and a second die adhesive layer on the second die backside.

17. The semiconductor package of claim 16, wherein the semiconductor package is integrated into one of a mobile phone, a mobile communication device, a pager, a personal digital assistant, a personal information manager, a mobile hand-held computer, a laptop computer, a wireless device, or a wireless modem.

18. A method of forming a side by side semiconductor package, the method comprising:
   attaching a first die having an active side and a backside to a carrier, the first die attached to the carrier by the backside of the first die;
   attaching a second die having an active side and a backside to the carrier horizontally adjacent and spaced from the first die, the second die attached to the carrier by the backside of the second die;
   attaching a bridge interposer having an active side and a backside to the active side of the first die and the active side of the second die, the bridge interposer attached to the first die and the second die by the backside of the bridge interposer;
   attaching a first substrate having a cavity to the backside of the bridge interposer such that the bridge interposer is positioned within the first substrate cavity;
   removing the carrier; and
   attaching a thermal element to the backside of the first die and the backside of the second die.

19. The method of claim 18, further comprising applying a thermal interface material to the backside of the first die and the backside of the second die before attaching the thermal element.

20. The method of claim 19, further comprising applying an adhesive layer to the backside of the bridge interposer before attaching the bridge interposer to the first substrate.

21. The method of claim 20, wherein the bridge interposer has routing pathways with a line and space parameter of 2/2 microns or less.

22. The method of claim 21, further comprising integrating the semiconductor package into one of a mobile phone, a mobile communication device, a pager, a personal digital assistant, a personal information manager, a mobile hand-held computer, a laptop computer, a wireless device, or a wireless modem.

23. A method of forming a side by side semiconductor package, the method comprising:
   attaching a first die having an active side and a backside to a carrier, the first die attached to the carrier by the backside of the first die;
   attaching a second die having an active side and a backside to the carrier horizontally adjacent and spaced from the first die, the second die attached to the carrier by the backside of the second die;
   attaching a bridge interposer having an active side and a backside to the active side of the first die and the active side of the second die, the bridge interposer attached to the first die and the second die by the backside of the bridge interposer;
   attaching a first substrate having a cavity to the backside of the bridge interposer such that the bridge interposer is positioned within the first substrate cavity;
   removing the carrier;
   attaching a second substrate having a cavity and a thermal element to the backside of the first die and the backside of the second die such that the first die and the second die are positioned with the cavity and thermally coupled to the thermal element.

24. The method of claim 23, further comprising applying a thermal interface material to the backside of the first die and the backside of the second die before attaching the second substrate.

25. The method of claim 24, further comprising applying an adhesive layer to the backside of the bridge interposer before attaching the bridge interposer to the first substrate.

26. The method of claim 25, wherein the bridge interposer has routing pathways with a line and space parameter of 2/2 microns or less.

27. The method of claim 26, further comprising integrating the semiconductor package into one of a mobile phone, a mobile communication device, a pager, a personal digital assistant, a personal information manager, a mobile hand-held computer, a laptop computer, a wireless device, or a wireless modem.

* * * * *